US012610760B2

(12) United States Patent (10) Patent No.: US 12,610,760 B2
Ono (45) Date of Patent: Apr. 21, 2026

(54) SEMICONDUCTOR CHIP AND MANUFACTURING METHOD THEREFOR

(71) Applicant: SONY SEMICONDUCTOR SOLUTIONS CORPORATION, Kanagawa (JP)

(72) Inventor: Shogo Ono, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 508 days.

(21) Appl. No.: 18/043,578

(22) PCT Filed: Aug. 25, 2021

(86) PCT No.: PCT/JP2021/031071
§ 371 (c)(1),
(2) Date: Feb. 28, 2023

(87) PCT Pub. No.: WO2022/054573
PCT Pub. Date: Mar. 17, 2022

(65) Prior Publication Data
US 2023/0307409 A1 Sep. 28, 2023

(30) Foreign Application Priority Data
Sep. 8, 2020 (JP) ................................. 2020-150276

(51) Int. Cl.
*H01L 21/268* (2006.01)
*H01L 23/00* (2006.01)
(52) U.S. Cl.
CPC ............ *H01L 24/32* (2013.01); *H01L 21/268* (2013.01); *H01L 24/16* (2013.01); *H01L 24/73* (2013.01);
(Continued)

(58) Field of Classification Search
CPC ....... H01L 24/32; H01L 21/268; H01L 24/16; H01L 24/73; H01L 24/94;
(Continued)

(56) References Cited

U.S. PATENT DOCUMENTS 3,838,501 A * 10/1974 Umbaugh ............... H01L 21/78
257/E29.022
6,583,512 B2 * 6/2003 Nakaoka ............. H01L 25/0657
257/796
(Continued)

FOREIGN PATENT DOCUMENTS

JP 2001-250843 A 9/2001
JP 2007-165855 A 6/2007
(Continued)

OTHER PUBLICATIONS

International Search Report and Written Opinion of PCT Application No. PCT/JP2021/031071, issued on Nov. 30, 2021, 09 pages of ISRWO.

*Primary Examiner* — Vu A Vu
(74) *Attorney, Agent, or Firm* — CHIP LAW GROUP

(57) ABSTRACT

The present disclosure relates to a semiconductor chip that allows electrical connections to be protected and a manufacturing method therefor.
A semiconductor chip has a strip-shaped region including a plurality of recesses on a side surface thereof. The recesses are arranged in a matrix of rows and columns on the side surface of the semiconductor chip or in a zig-zag pattern in the region. At least two of the strip-shaped regions are formed. The strip-shaped regions are formed in different positions between the vicinity of the center and opposed ends of the side surface. The strip-shaped region is partly inclined. The present disclosure can be applied for example to a semiconductor chip for a semiconductor device in which
(Continued)

connections for electrically connecting the semiconductor chip and the substrate are protected with underfill.

11 Claims, 15 Drawing Sheets

(52) U.S. Cl.
CPC .... *H01L 24/94* (2013.01); *H01L 2224/16227* (2013.01); *H01L 2224/26145* (2013.01); *H01L 2224/32155* (2013.01); *H01L 2224/73204* (2013.01); *H01L 2224/94* (2013.01); *H01L 2924/1011* (2013.01)

(58) Field of Classification Search
CPC ....... H01L 2224/73204; H01L 2224/94; H01L 2924/1011; H01L 21/6836; H01L 21/78; H01L 24/92; H01L 21/563; H01L 2224/0401; H01L 2224/16225; H01L 2224/32225; H01L 2224/92125; H01L 2924/10155; H01L 2924/10156; H10D 62/117
USPC ......................................................... 257/737
See application file for complete search history.

(56) References Cited

U.S. PATENT DOCUMENTS

| | | | | |
|---|---|---|---|---|
| 6,759,745 | B2 * | 7/2004 | Masumoto | H01L 23/3114 |
| | | | | 257/730 |
| 7,378,728 | B2 * | 5/2008 | Ito | H01L 24/97 |
| | | | | 257/E23.009 |
| 7,675,153 | B2 * | 3/2010 | Kurosawa | H01L 24/29 |
| | | | | 257/723 |
| 8,072,044 | B2 * | 12/2011 | Gruenhagen | H01L 21/78 |
| | | | | 257/618 |
| 9,768,120 | B2 * | 9/2017 | Seng | H01L 24/03 |
| 10,403,603 | B2 * | 9/2019 | Park | H01L 25/0657 |
| 10,535,588 | B2 * | 1/2020 | Rodriguez | H10H 20/819 |
| 10,629,485 | B2 * | 4/2020 | Mähner | H01L 21/78 |
| 11,139,285 | B2 * | 10/2021 | Tsou | H01L 23/3737 |
| 11,521,917 | B2 * | 12/2022 | Futamura | H01L 23/4951 |
| 11,887,858 | B2 * | 1/2024 | Nunotani | H10D 8/60 |
| 2004/0026768 | A1 * | 2/2004 | Taar | H01L 25/0657 |
| | | | | 257/E29.022 |

FOREIGN PATENT DOCUMENTS

| | | | |
|---|---|---|---|
| JP | 2011-051011 | A | 3/2011 |
| JP | 2017118145 | A | 6/2017 |
| JP | 2020-036048 | A | 3/2020 |

\* cited by examiner

SEMICONDUCTOR CHIP AND MANUFACTURING METHOD THEREFOR

CROSS REFERENCE TO RELATED APPLICATIONS

This application is a U.S. National Phase of International Patent Application No. PCT/JP2021/031071 filed on Aug. 25, 2021, which claims priority benefit of Japanese Patent Application No. JP 2020-150276 filed in the Japan Patent Office on Sep. 8, 2020. Each of the above-referenced applications is hereby incorporated herein by reference in its entirety.

TECHNICAL FIELD

The present disclosure relates to a semiconductor chip and a manufacturing method therefor, for example, to a semiconductor chip that ensures more reliable protection of electrical connections and a manufacturing method therefor.

BACKGROUND ART

In some commercially available semiconductor devices, electrode components are attached on chips cut from a wafer and the chips are mounted on a circuit board. For example, PTL 1 suggests an approach for improving mounting operability when semiconductor chips are mounted on a substrate with an adhesive such as thermoplastic resin in such a semiconductor device.

CITATION LIST

Patent Literature

[PTL 1]
JP 2001-250843A

SUMMARY

Technical Problem

When applying thermosetting resin, failure to properly control the thermosetting resin that crawls up on the side surfaces of a semiconductor chip may cause for example the thermosetting resin to seep onto the semiconductor chip surface. Meanwhile, electrical connections may be exposed if the thermosetting resin is not sufficiently applied.

It is desired to appropriately control thermosetting resin that crawls up on the side surfaces of the semiconductor chip.

In view of the foregoing, the present disclosure is directed to appropriate control of thermosetting resin that crawls up on a side surface of a semiconductor chip.

Solution to Problem

The semiconductor chip according to one aspect of the disclosure has a strip-shaped region including a plurality of recesses on the side surfaces of the semiconductor chip.

According to one aspect of the present disclosure, a semiconductor chip manufacturing device manufactures a semiconductor chip having a strip-shaped region including a plurality of recesses on a side surface of the semiconductor chip and forms the recesses by internally focusing laser light.

A semiconductor chip according to one aspect of the present disclosure includes a strip-shaped region including a plurality of recesses on a side surface of the semiconductor chip.

In the manufacturing method according to one aspect of the present disclosure, the semiconductor chip is manufactured.

DESCRIPTION OF EMBODIMENTS

Hereinafter, modes for carrying out the present disclosure (hereinafter referred to as "embodiments") will be described.

<Configuration of Semiconductor Device>

Figure 1:
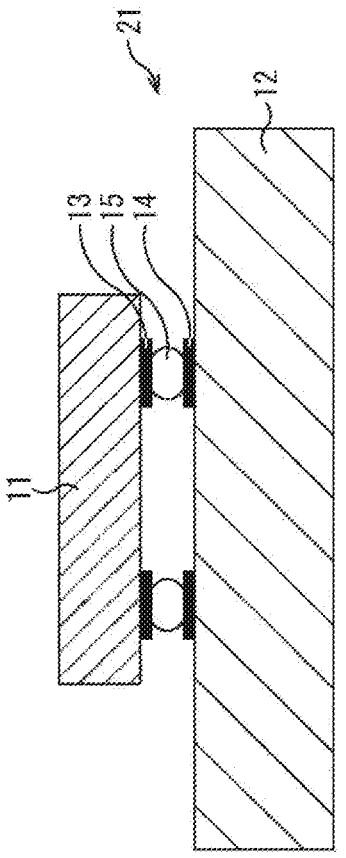
FIG. 1 is a view of an exemplary configuration of a semiconductor device.

FIG. 1 is a view of an exemplary configuration of a semiconductor device. Semiconductor chips 11 singulated from a wafer are for example mounted on a substrate 12 such as a printed circuit board. An electrode 13 is formed at the semiconductor chip 11 in order to electrically connect the semiconductor chip 11 and the substrate 12, and the substrate 12 is provided with a circuit pattern 14.

The electrode 13 of the semiconductor chip 11 and the circuit pattern 14 of the substrate 12 are connected through a projection electrode (bump) 15. The electrode 13, the circuit pattern 14, and the projection electrode 15 are made of a highly conductive material such as gold, aluminum, and copper. Parts of the electrode 13, the circuit pattern 14, and the projection electrode 15 will be also referred to as electrical connections as appropriate. Here, the device having the semiconductor chip 11 and the substrate 12 connected with each other through the electrical connections will be described as the semiconductor device 21.

Figure 2:
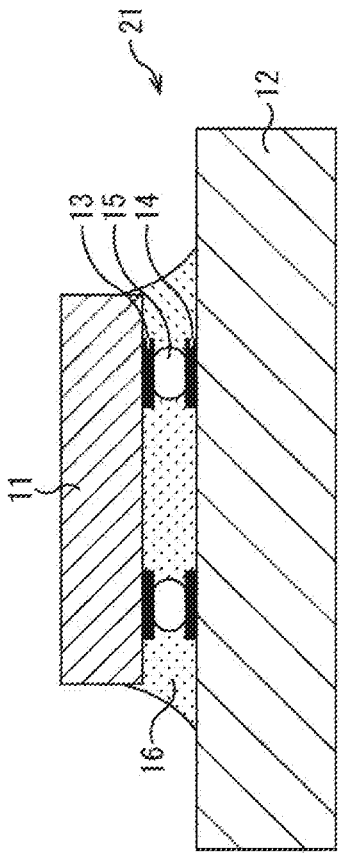
FIG. 2 is a view of an exemplary configuration of a semiconductor device.

As shown in FIG. 2, sealing resin referred to as underfill 16 is applied in the gap between the semiconductor chip 11 and the substrate 12 in order to prevent the electrical connections from being broken by externally applied impact or stress upon the semiconductor device 21 or the electrical connections from degrading because of humidity and improve the connection reliability. The application of the underfill 16 ensures that the electrical connections are protected.

Figure 3:
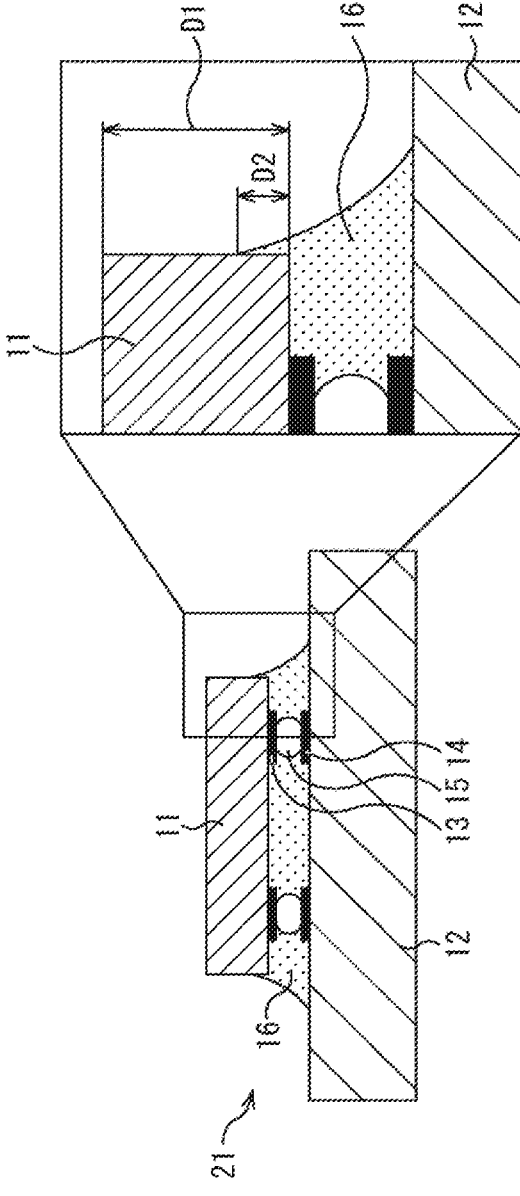
FIG. 3 is a view for illustrating how underfill crawls up.
Figure 4:
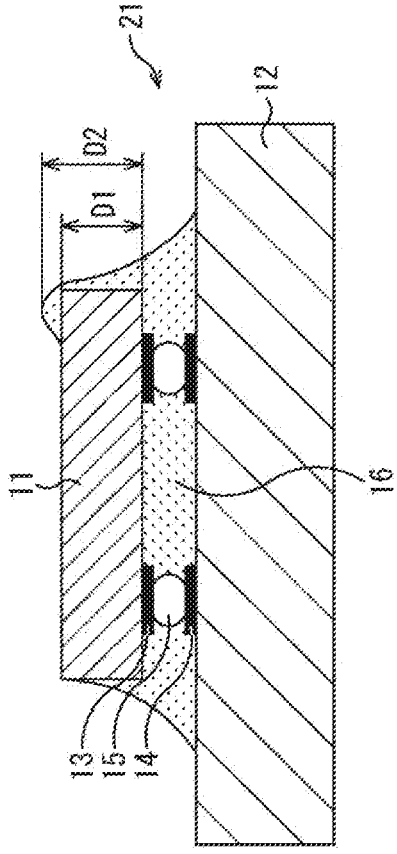
FIG. 4 is a view for illustrating how underfill crawls up.
Figure 5:
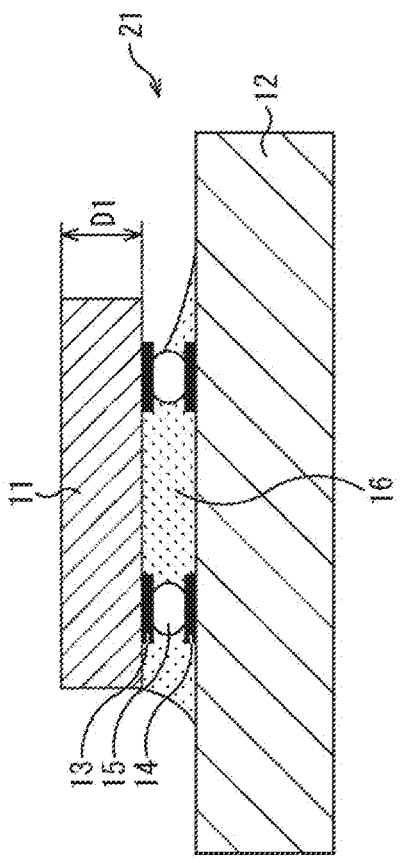
FIG. 5 is a view for illustrating how underfill crawls up.

Referring to FIGS. 3 to 5, how the crawling up of the underfill 16 is controlled will be described. FIG. 3 is an enlarged view of the semiconductor chip 11 shown in FIG. 2 and a part of a side surface of the semiconductor chip 11. As shown in the enlarged view in FIG. 3 (the right part in FIG. 3), the semiconductor chip 11 has a thickness D1, and the crawling height of the underfill 16 on the side surface of the semiconductor chip 11 is D2.

As shown in FIG. 3, the crawling height D2 of the underfill 16 is preferably within the thickness D1 of the semiconductor chip 11. As shown in FIG. 4, when the height D2 becomes greater than the thickness D1, and the underfill 16 crawls to reach the upper surface of the semiconductor chip 11 (while the electrode 13 is formed on the lower surface), the property of the semiconductor device 21 may be impaired.

As shown in FIG. 5, when the underfill 16 does not crawl much and falls short of the lower surface of the semiconductor chip 11, in other words, when the underfill 16 is not sufficiently filled in the gap between the semiconductor chip 11 and the substrate 12, the electrical connections may partly be exposed, which may lower the protection performance for the electrical connections.

The crawling amount of the underfill 16 can be large as shown in FIG. 4 or conversely small as shown in FIG. 5, in other words, the application amount can hardly be appropriate. When the semiconductor device 21 is reduced in height, the semiconductor chip 11 has a smaller thickness D2, which makes it even more difficult to control the underfill 16 in an appropriate application amount.

<Semiconductor Chip which Allows Underfill Crawling to be Controlled>

Figure 6:
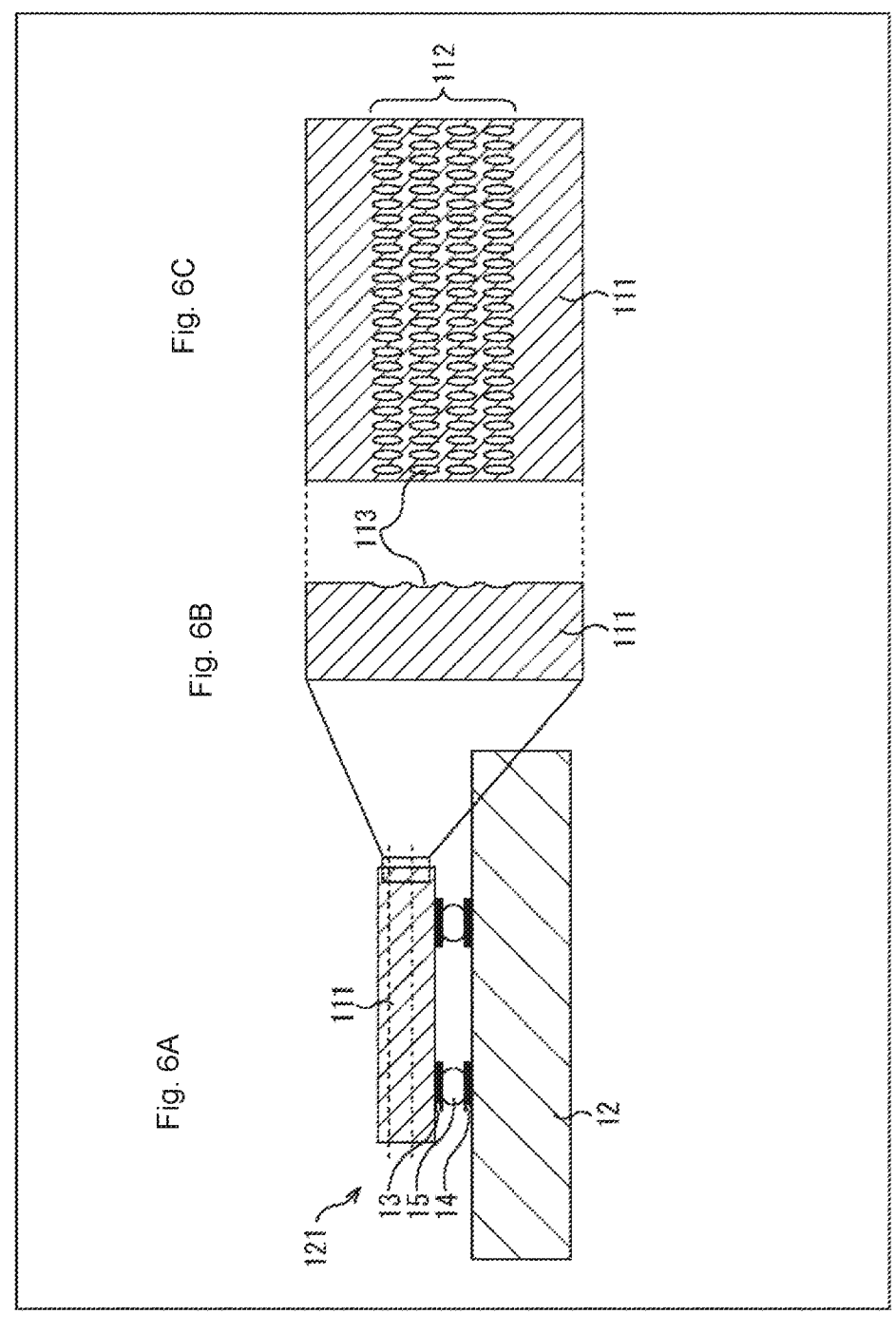
FIGS. 6A, 6B, and 6C are views of a semiconductor chip according to one embodiment to of the present disclosure.

FIG. 6A is a view of an exemplary configuration of a semiconductor device 121 to which the present disclosure is applied as viewed in the lateral direction. In the semiconductor device 121 shown in FIG. 6A, the same parts as those of the semiconductor device 21 in FIG. 1 will be denoted by the same reference characters and their description will not be provided.

The semiconductor chip 111 of the semiconductor device 121 shown in FIG. 6A has an underfill pocket region 112 as shown in FIGS. 6B and 6C. FIGS. 6B and 6C show enlarged views of the region of the semiconductor chip 11 where the underfill pocket region 112 is formed. FIG. 6B illustrates the side surface as viewed in the lateral direction, and FIG. 6C illustrates the side surface viewed from the front with respect to the side surface.

A plurality of underfill pockets 113 are formed in the underfill pocket region 112. The underfill pockets 113 are formed as recesses having a prescribed depth at the side surface of the semiconductor chip 111. The shape may be circular, elliptical, or rectangular. The underfill pocket 113 has a substantially elliptical shape when formed by the following method.

The underfill pocket region 112 may be formed at the four side surfaces of the semiconductor chip 111 or two or three side surfaces of the four side surfaces.

The recess of the underfill pocket 113 may have a thickness about in the range from 1 μm to 3 μm. The underfill pocket region 112 is formed in a region having a width at least one fifth of the thickness D1 of the semiconductor chip 111. For example, when the thickness D1 is 100 μm, the underfill pocket region 112 has a width (height) of at least 20 μm.

As shown in FIG. 6C, a plurality of underfill pockets 113 are arranged in a matrix of rows and columns to form the strip-shaped underfill pocket region 112. Any number of underfill pockets 113 may be arranged in the underfill pocket region 112 in the row-direction and the column direction.

Note that when the recess of the underfill pocket 113 has a greater depth or size, the semiconductor chip 111 may have a reduced strength. Meanwhile, when the recess of the underfill pocket 113 has a smaller depth or size, the following advantageous effects may not be provided. Therefore, the underfill pocket 113 is preferably formed to have an appropriate depth and size.

Figure 7:
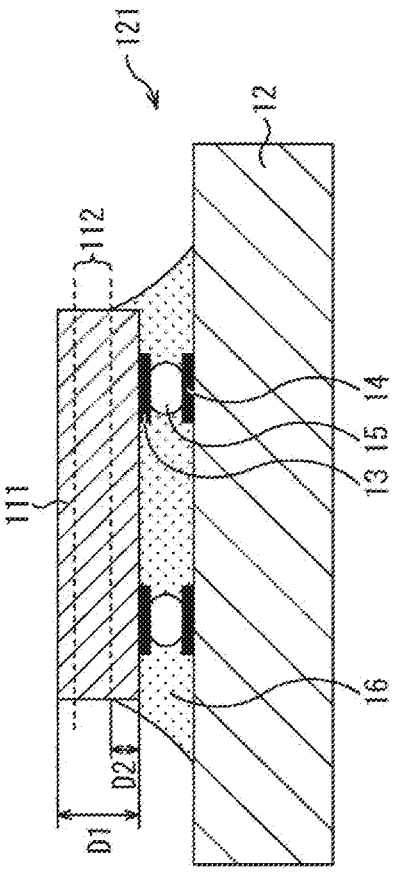
FIG. 7 is a view for illustrating control of the underfill crawling amount.

As shown in FIG. 7, the presence of the underfill pocket region 112 can control the crawling of the underfill 16 when the underfill 16 is applied. Even when a sufficient amount of the underfill 16 is applied to ensure that the electrical connections are not exposed, the crawling of the underfill 16 can be stopped by the underfill pockets 113 of the underfill pocket region 112.

The presence of the underfill pockets 113 allows excess underfill 16 to be absorbed by the underfill pockets 113 when the underfill 16 is amply applied. The semiconductor chip 11 has irregularities on the side surfaces thereof, which causes more friction than the shape without irregularities, and the crawling of the underfill 16 can be stopped by the underfill pocket region 112.

Therefore, the crawling height D2 of the underfill 16 can be kept within the thickness D1 of the semiconductor chip 111, and the crawling of the underfill 16 can be controlled.

The presence of the underfill pocket region 112 allows the semiconductor chip 111 to have a smaller size than the conventional semiconductor chip 11. The semiconductor chip 11 shown in the upper part of FIG. 8 corresponds to the case provided by using the conventional structure for controlling the crawling of the underfill 16 which has been proposed about the semiconductor device 21 for example as shown in FIGS. 1 and 2.

In the conventional semiconductor chip 11, it has been proposed to provide the side surfaces of the semiconductor chip 11 with a step in order to control the crawling of the underfill 16. The upper surface of the semiconductor chip 11 has a width L1, and the lower surface has a width L2. The width L2 is obtained by adding the width L3 of the step to the width L1, in other words, the relationship represented by width L1=width L2+width L3+width L3 holds. It has been suggested that the presence of the step having the width L3 can prevent the underfill 16 from crawling up beyond the step.

Figure 8:
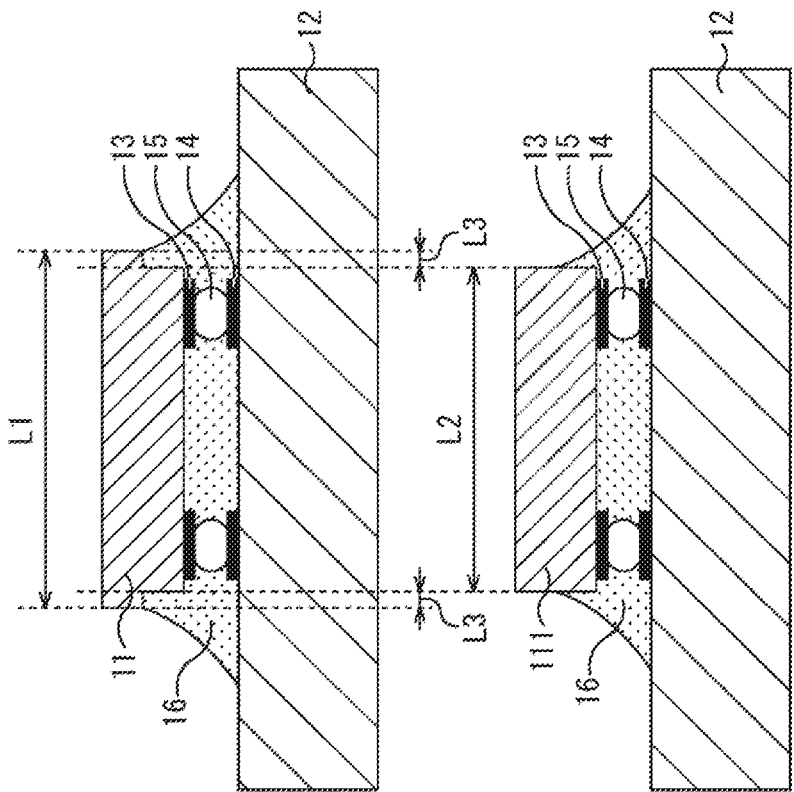
FIG. 8 is a view for illustrating how a semiconductor chip is reduced in size.

The semiconductor chip 111 shown in the lower part of FIG. 8 includes the underfill pocket region 112 shown in FIG. 7. As described above, the presence of the underfill pocket region 112 can control the crawling of the underfill 16, while the underfill pocket region 112 is provided at the side surfaces of the semiconductor chip 111 and does not need the width L3. More specifically, as shown in the lower part of FIG. 8, the width of the semiconductor chip 111 including the underfill pocket region 112 can be the width L2.

While the conventional semiconductor chip 11 has the width L1, the semiconductor chip 111 including the underfill pocket region 112 can be formed with the width L2, it is clear that the chip can be smaller at least by the width L3×2. More specifically, the semiconductor chip 111 can be reduced in size by applying the present disclosure, and the semiconductor device 121 including the semiconductor chip 111 can be reduced in size.

Even when the semiconductor chip 111 is formed to be thin, the presence of the underfill pocket region 112 allows the crawling of the underfill 16 to be controlled, which clearly indicates that the semiconductor chip 111 can be reduced in size. In the semiconductor chip 111 having a thickness of 100 μm or less, the crawling of the underfill 16 can be controlled by applying the present disclosure, so that the electrical connections can be prevented from being exposed and can be protected appropriately.

When the present disclosure is applied, it is no longer necessary to provide a step unlike the conventional semiconductor chip 11, and the semiconductor chip 111 may have a reduced area, which can reduce the cost.

<Exemplary Configuration of Underfill Pocket Region>

Figure 9:
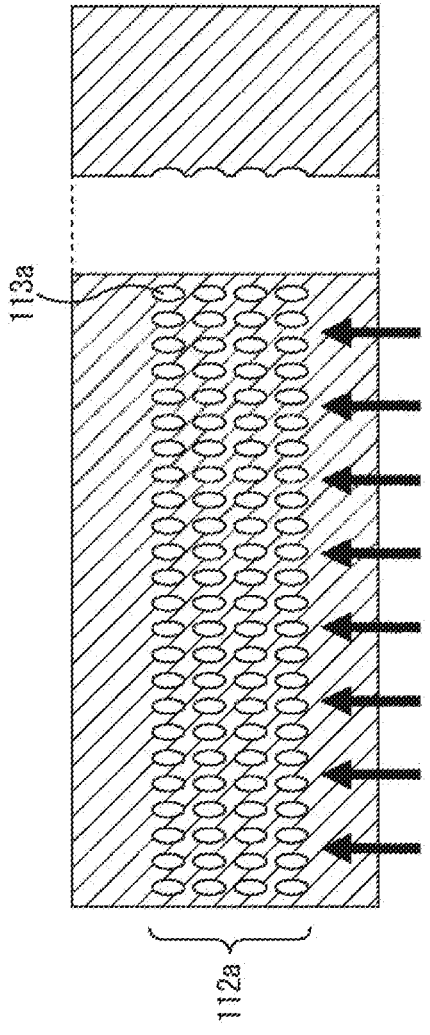
FIG. 9 is a view of an exemplary configuration of an underfill pocket region.

The configuration of the underfill pocket region 112 will be described. FIG. 9 includes a front view of the surface of the semiconductor chip 111 having the underfill pocket region 112, a plan view thereof, and a side view thereof from the lateral side.

The arrows in FIG. 9 represent the direction in which the underfill 16 crawls up and indicates that the underfill 16 crawls up from the lower side to the upper side of the figure. Stated differently, the lower side in the figure corresponds to the lower surface of the semiconductor chip 111, and the upper side corresponds to the upper surface of the semiconductor chip 111. The same applies to FIGS. 10, 11, 12A, 12B, 13A, and 13B.

An underfill pocket region 112a shown in FIG. 9 is formed in the vicinity of the center of a semiconductor chip 111. The underfill pockets 113a in the underfill pocket region 112a are arranged in a matrix of m rows and n columns and the underfill pocket region 112a is formed in a strip shape having a prescribed width (height). The strip-shaped underfill pocket region 112a is formed in such a position that the center line is in the vicinity of the center of the semiconductor chip 111 in the thickness-wise direction.

Figure 10:
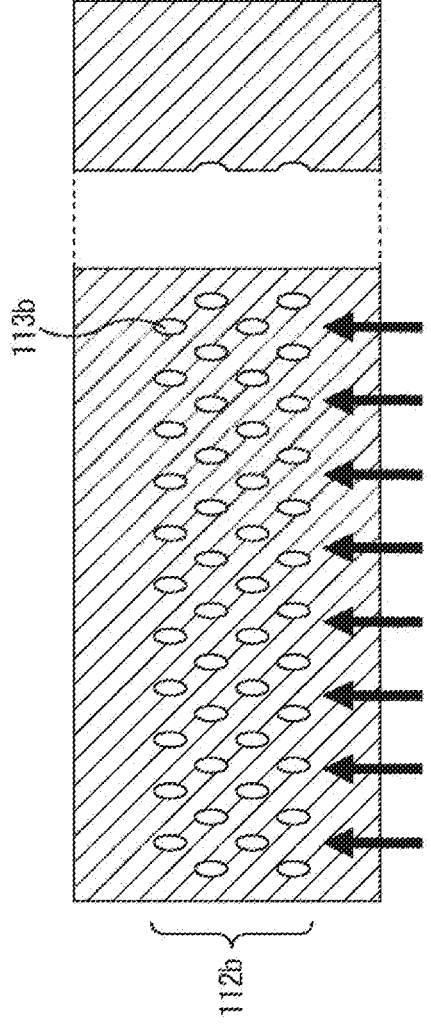
FIG. 10 is a view of an exemplary configuration of an underfill pocket region.

FIG. 10 is a view of another exemplary configuration of the underfill pocket regions 112. An underfill pocket region 112b shown in FIG. 10 is a strip-shaped region in which underfill pockets 113b are arranged in a zigzag pattern. The underfill pocket region 112b shown in FIG. 10 is obtained by thinning out the underfill pockets 113a in the underfill pocket region 112a in FIG. 9.

Four underfill pockets 113a are formed in the column direction of the underfill pocket region 112a shown in FIG. 9, while two underfill pockets 113b are formed in the column direction of the underfill pocket region 112b shown in FIG. 10. In the row direction of the underfill pocket region 112b shown in FIG. 10, the underfill pockets 113b are formed for every other column.

The underfill pocket region 112b shown in FIG. 10 may be used when the semiconductor chip 111 is formed for example using a fragile substrate. For example, when the semiconductor chip 111 is formed using a GaAs (gallium arsenic) substrate, the arrangement of the underfill pocket region 112b with a smaller number of underfill pockets 113 may be applied.

In this way, an appropriate configuration may be set as the structure of the underfill pocket region 112 depending on the strength of the substrate.

Figure 11:
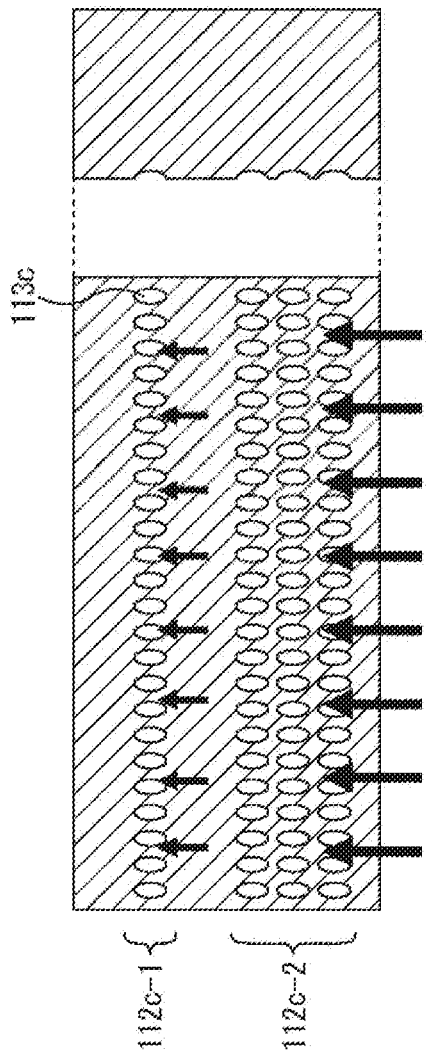
FIG. 11 is a view of an exemplary configuration of an underfill pocket region.

FIG. 11 is a view of another exemplary configuration of the underfill pocket regions 112. The underfill pocket region 112c shown in FIG. 11 is different from the other underfill pocket regions 112 in that the region has two stages. The underfill pocket region 112c shown in FIG. 11 includes a strip-shaped underfill pocket region 112c-1 and a strip-shaped underfill pocket region 112c-2.

The underfill pocket region 112c-1 is formed on the lower surface side of the semiconductor chip 111, and the underfill pocket region 112c-2 is formed on the upper surface side of the semiconductor chip 111. In the example shown in FIG. 11, the underfill pocket region 112c-1 has three rows of the underfill pockets 113c, and the underfill pocket region 112c-2 has one row of the underfill pockets 113c.

The underfill pocket region 112c-1 is positioned nearer to the side to which the underfill 16 crawls up than the underfill pocket region 112c-2, and therefore more underfill pockets 113 are formed.

In FIG. 11, the arrow thickness represents the amount of underfill 16 that may crawl up. As shown in FIG. 11, the crawling amount of the underfill 16 is greater in the underfill pocket region 112c-1 than in the underfill pocket region 112c-2. Therefore, the number of underfill pockets 113c formed in the underfill pocket region 112c-1 is greater than the number of underfill pockets 113c in the underfill pocket region 112c-2.

When the underfill pocket region 112c is formed to have the two stages, and the crawling of the underfill 16 which cannot be stopped in the underfill pocket region 112c-1 in the first stage can be stopped by the underfill pocket region 112c-2.

Note that in FIG. 11, the underfill pocket region 112c is formed in two stages by way of illustration, but the region may be formed in two or more stages.

The arrangement of the underfill pocket region 112b shown in FIG. 10 may be used for one or both of the underfill pocket regions 112c-1 and 112c-2 shown in FIG. 11.

Figure 12:
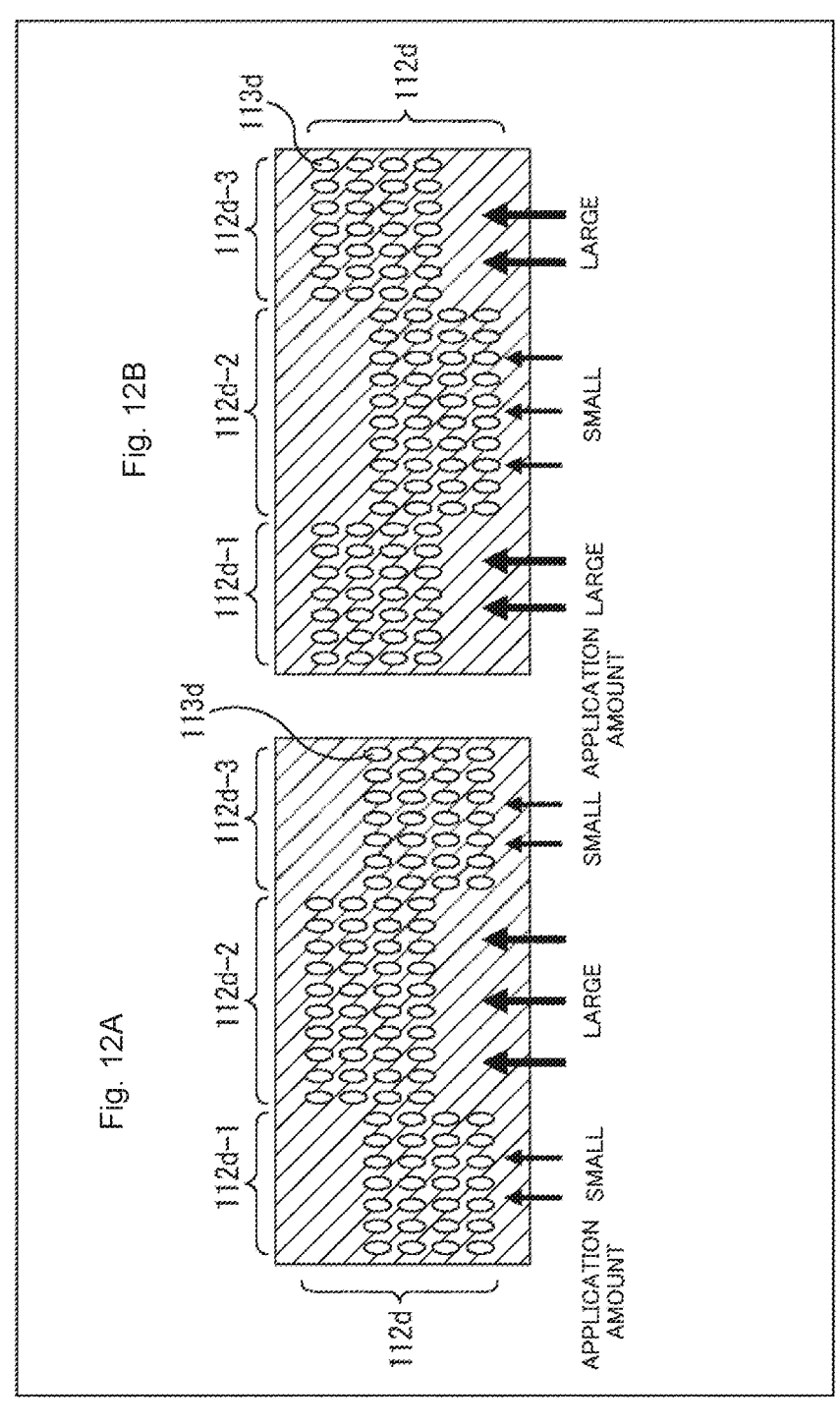
FIGS. 12A and 12B are views of an exemplary configuration of an underfill pocket region.

FIGS. 12A and 12B are views of another exemplary configuration of the underfill pocket regions 112. An underfill pocket region 112d formed on one surface of the semiconductor chip 111 shown in FIGS. 12A and 12B are formed to have steps.

In the example shown in FIG. 12A, an underfill pocket region 112d-2 formed in a strip shape in the center part of a prescribed side surface of the semiconductor chip 111 in the lateral direction in the figure is in a higher position or a position closer to the upper surface than an underfill pocket region 112d-1 and an underfill pocket region 112d-2 formed in a strip shape and on opposed sides.

The arrow thickness in FIGS. 12A and 12B represent the application amount of the underfill 16, and the application amount increases as the thickness increases. In the example shown in FIG. 12A, the application amount is large in the vicinity of the center of the side surface of the semiconductor chip 111 and small on both sides of the vicinity of the center. The underfill 16 crawls up higher in areas where the application amount is larger than in areas where the application amount is smaller.

Therefore, in the example shown in FIG. 12A, the underfill pocket region 112d-2 in the vicinity of the center where the application amount of the underfill 16 is large is formed in a high position (nearer to the upper surface), and the underfill pocket regions 112d-1 and 112d-3 where the amount of the underfill 16 is small are formed in a low position (nearer to the lower surface).

In the example shown in FIG. 12B, the application amount is small in the vicinity of the center region of the side surface of the semiconductor chip 111 and the application amount is large on both sides of the vicinity of the center. In the example shown in FIG. 12B, the underfill pocket region 112d-2 in the vicinity of the center where the application amount of the underfill 16 is small is formed in a low position (nearer to the lower surface) and the underfill pocket regions 112d-1 and 112d-3 on the sides where the application amount of the underfill 16 is large are in a high position (nearer to the upper surface).

In this way, the position of where the underfill pocket region 112d is formed may be varied depending on the application amount of the underfill 16.

Note that when the underfill pocket region 112d is stepped, the underfill pockets 113d are continuous at least in one row when viewed in the row (lateral) direction. In the example shown in FIGS. 12A and 12B, the underfill pockets 113d are continuously formed in two rows. More specifically, the underfill pockets 113d are arranged so that there is no such location where the underfill 16 leaks because of the increased intervals of the underfill pockets 113d.

The arrangement of the underfill pocket region 112b shown in FIG. 10 may be used for at least one of the underfill pocket regions 112d-1 to 112d-3 shown in FIGS. 12A and 12B.

The arrangement of the underfill pocket region 112c shown in FIG. 11 may be used for at least one of the underfill pocket regions 112d-1 to 112d-3 shown in FIGS. 12A and 12B, so that the underfill pocket region 112d may be formed in multiple stages.

Figure 13:
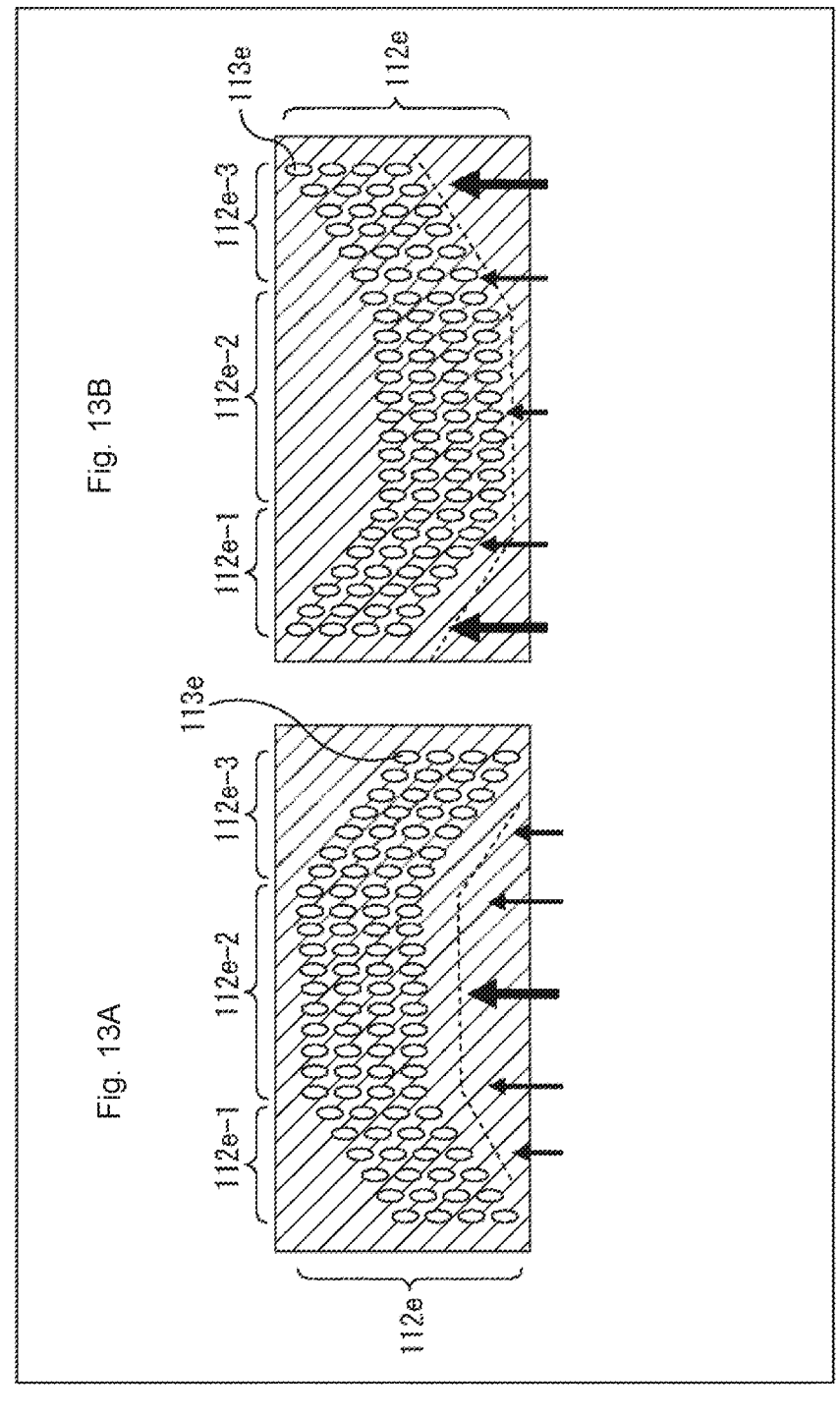
FIGS. 13A and 13B are views of an exemplary configuration of an underfill pocket region.

Similarly to the example shown in FIGS. 12A and 12B, the positions of the regions of the underfill pocket region 112e are varied depending on the application amount of the underfill 16 in the example shown in FIGS. 13A and 13B.

In the example shown in FIG. 13A, the application amount of the underfill 16 increases gradually from one end of a side surface of the semiconductor chip 111 to the vicinity of the center and then decreases from the vicinity of the center to the other end. The position to form the underfill pocket region 112e is set depending on the application amount of the underfill 16.

As shown in FIG. 13A, the region where the application amount of the underfill 16 gradually increases from one end to the vicinity of the center, a strip-shaped underfill pocket region 112e-1 is formed to have an obliquely upward arrangement of the underfill pockets 113e. In the vicinity of the center of the side surface of the semiconductor chip 111, a strip-shaped underfill pocket region 112e-2 with no inclination is formed.

In the region where the application amount of the underfill 16 gradually decreases from the vicinity of the center to the other end, an underfill pocket region 112e-3 is formed to have an obliquely downward arrangement of underfill pockets 113e.

In the example shown in FIG. 13B, the application amount of the underfill 16 is larger on the opposed ends of the side surface of the semiconductor chip 111, and the application amount of the underfill 16 decreases gradually from the ends to the vicinity of the center.

As shown in FIG. 13B, in the region where the application amount of the underfill 16 decreases gradually from an end to the vicinity of the center, the strip-shaped underfill pocket region 112e-1 is formed to have an obliquely downward arrangement of underfill pockets 113e.

In the vicinity of the center of the side surface of the semiconductor chip 111, a strip-shaped underfill pocket region 112e-2 with no inclination is formed. In the region where the application amount of the underfill 16 gradually increases from the vicinity of the center to the other end, a strip-shaped underfill pocket region 112e-3 is formed to have an obliquely upward arrangement of underfill pockets 113e.

In this way, according to the gently varying application amount of the underfill 16, the position of the underfill pocket region 112e may be gently varied.

The arrangement of the underfill pocket region 112b shown in FIG. 10 may be used for at least one of the underfill pocket regions 112e-1 to 112e-3 shown in FIGS. 13A and 13B.

The arrangement of the underfill pocket region 112c shown in FIG. 11 may be used for at least one of the underfill pocket regions 112e-1 to 112e-3 shown in FIGS. 13A and 13B, so that the underfill pocket region 112e may be formed in multiple stages.

<Formation of Underfill Pocket Region>

Figure 14:
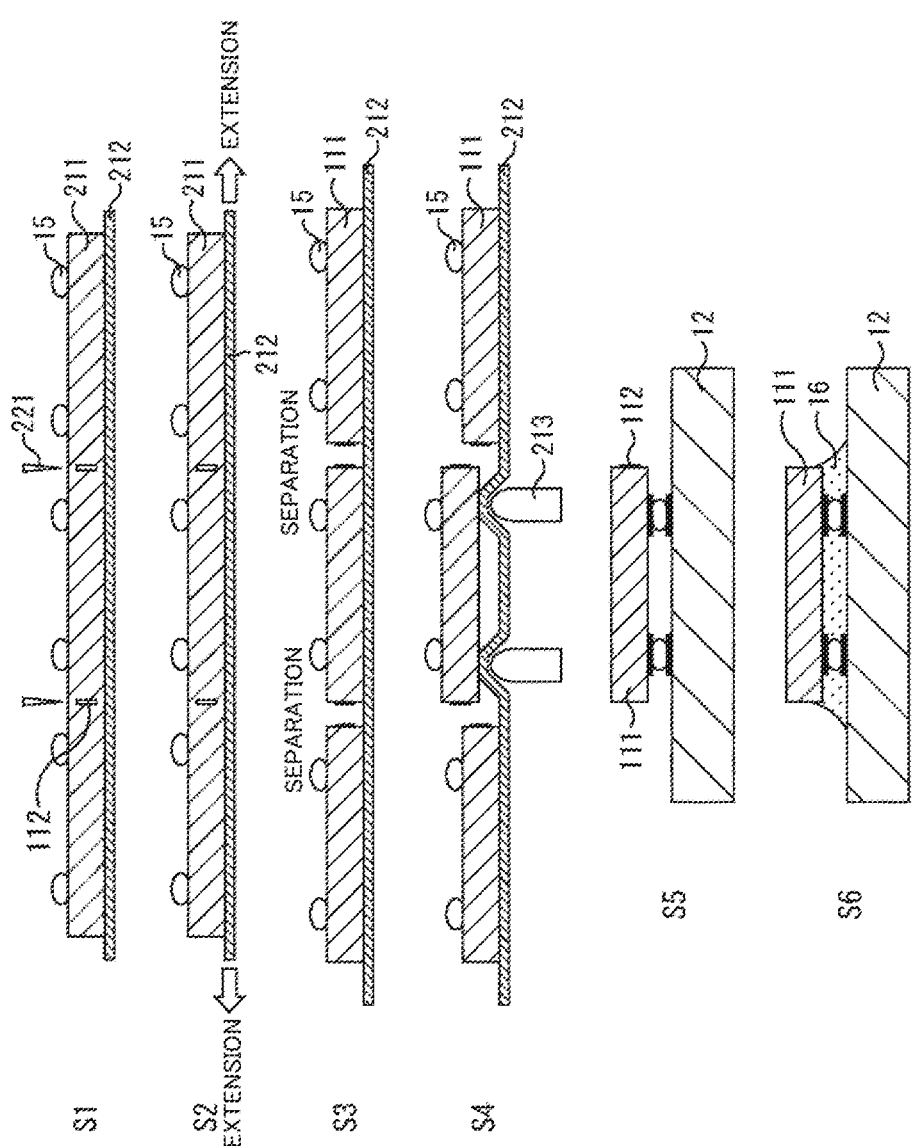
FIG. 14 is a view for illustrating how an underfill pocket region is formed.

Referring to FIG. 14, steps for manufacturing the semiconductor chip 111 having the underfill pocket region 112 and the semiconductor device 121 including the semiconductor chip 111 will be described.

In step S1, a substrate 211 including a projection electrode 15 is prepared. The substrate 211 is to be singulated into semiconductor chips 111 and may be a silicon substrate.

A dicing tape 212 is adhered to the substrate 211. The substrate is irradiated with laser light 221 at a dicing position. The dicing position corresponds to the position of the semiconductor chip 111 to be a side surface after singulation. After the irradiation with the laser light 221, underfill pockets 113 are formed at the side surface of the semiconductor chip 111, and an underfill pocket region 112 is formed.

Figure 15:
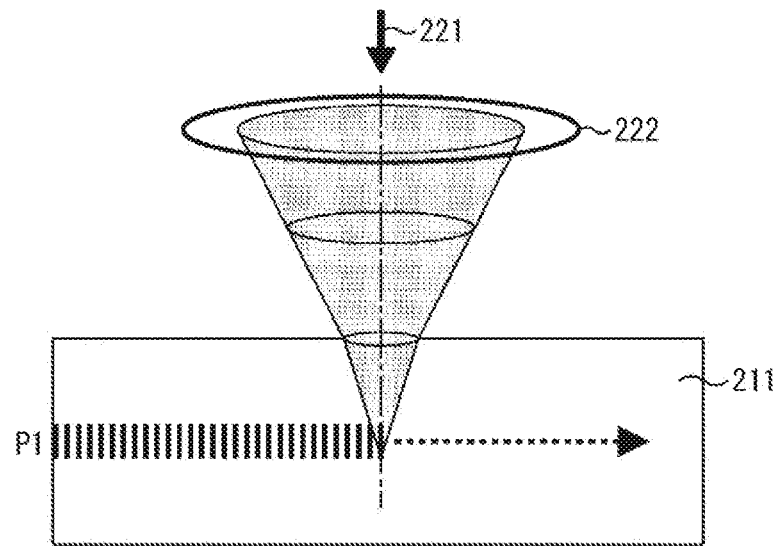
FIG. 15 is a view for illustrating laser irradiation.

Referring to FIG. 15, how the underfill pockets 113 are formed by the irradiation with the laser light 221 will be described. The laser light 221 is directed on the substrate 211 through a focus lens 222. The laser light 221 is emitted for internal focusing at a prescribed position P1 in the substrate 211. The laser light 221 may be emitted using a YAG laser with a wavelength in the infrared region. The laser light 221 may be pulse type laser light.

When the output intensity of the laser light 221 is raised, the laser light focused at the internal focusing position P1 partly leaks out behind the position P1. The position behind the position P1 is on the lower side in FIG. 15 and nearer to the dicing tape 212 in FIG. 14. The side with the adhering dicing tape 212 is to be the upper surface side of the semiconductor chip 111 after singulation.

Underfill pockets 113 are formed by the laser light 221 leaking behind the internal focusing position P1. The number of underfill pockets 113 to be formed in the column direction can be controlled by the intensity of the laser light 221.

The internal focusing position P1 for the laser light 221 relates to the position of the first one of the plurality of underfill pockets 113 to be formed in the column direction, or stated differently, to the position of the strip-shaped underfill pocket region 112 on one end side. As the internal focusing position P1 is controlled, the position of the region for forming the underfill pocket region 112 can be controlled.

When the underfill pocket region 112a shown in FIG. 9 is formed, the strip-shaped underfill pocket region 112 can be formed by directing the laser light 221 without changing the focusing position P1 for the laser light 221 and the intensity of the laser light.

When the underfill pocket region 112b shown in FIG. 10 is formed, the focusing position P1 for the laser light 221 may be changed on a column-basis, so that the strip-shaped underfill pocket region 112 can be formed. When the underfill pocket region 112b is formed, the intensity of the laser light 221 does not have to be changed.

When the underfill pocket region 112c shown in FIG. 11 is formed, the focusing position P1 for the laser light 221 is set to a position where the underfill pocket region 112c-1 in the first stage is desired to be formed and the laser light 221 is directed upon the position. Then, the focusing position P2 for the laser light 221 is set to a position where the underfill pocket region 112c-2 in the second stage is desired to be formed and the laser light 221 is directed upon the position. The laser light 221 has a greater intensity for forming the underfill pocket region 112c-1 in the first stage than the intensity for forming the underfill pocket region 112c-2 in the second stage.

When the underfill pocket region 112d shown in FIGS. 12A and 12B are formed, the focusing position P1 for forming the underfill pocket regions 112d-1 and 112d-3 and the focusing position P2 for forming the underfill pocket region 112d-2 are set to different positions, and the laser light 221 is directed upon the positions, so that the underfill pocket region 112d can be formed.

When the underfill pocket region 112e shown in FIGS. 13A and 13B are formed, the focusing position P1 for forming the underfill pocket regions 112d-1 and 112d-3 is changed on a column basis, and the laser light 221 is directed on the position, while the focusing position P2 for forming the underfill pocket region 112d-2 is set to a position different from the focusing position P1 and the laser light 221 is directed upon the position P2, so that the underfill pocket region 112d can be formed.

In this way, as the intensity of the laser light 221 and the focusing positions thereof are set appropriately, the underfill pocket region 112 can be formed.

The underfill pocket region 112 is formed as described above in step S1 (FIG. 14). The dicing tape 212 is extended in steps S2 and S3, so that a crack is extended from the underfill pocket region 112 as the origin to the front and back surfaces, so that the substrate 211 is separated. The substrate 211 is singulated into semiconductor chips 111 by the separation.

In step S4, the separated individual semiconductor chips 111 are each pushed and picked up by needle pins 213 and mounted on a substrate 12 and electrically connected with the substrate 12 in step S5.

In step S6, underfill 16 is applied in the gap between the semiconductor chip 111 and the substrate 12 for example using a dispenser and may be cured in an oven.

In this way, the semiconductor chip 111 having the underfill pocket region 112 is produced, and the underfill 16 is applied. The underfill pocket region 112 can be formed when a layer to function as an origin for separation is formed as described above, and therefore the region can be formed without increasing the number of steps.

For example, the semiconductor chip 111 can be used as a chip for an image sensor. The disclosure can be applied to a distance measuring device for distance measuring using an image sensor.

The advantageous effects disclosed herein are merely examples and are not intended as limiting, and other advantageous effects may be provided.

Note that embodiments of the present disclosure are not limited to the above-described embodiment, and various modifications can be made without departing from the gist of the disclosure.

Note that the present disclosure can also be configured as follows.

(1)
A semiconductor chip having a strip-shaped region including a plurality of recesses on a side surface of the semiconductor chip.
(2)
The semiconductor chip according to (1), wherein the recesses are arranged in a matrix of rows and columns on the side surface of the semiconductor chip.
(3)
The semiconductor chip according to (1), wherein the recesses are arranged in a zig-zag pattern in the region.
(4)
The semiconductor chip according to any one of (1) to (3), wherein at least two of the strip-shaped regions are provided.
(5)
The semiconductor chip according to any one of (1) to (4), wherein the strip-shaped regions are formed in different positions between opposed ends and a vicinity of a center of the side surface.
(6)
The semiconductor chip according to any one of (1) to (4), wherein the strip-shaped region is partly inclined.
(7)
The semiconductor chip according to any one of (1) to (4), wherein the position of the strip-shaped region on the side surface is set depending on an underfill application amount.
(8)
The semiconductor chip according to any one of (1) to (7), wherein the strip-shaped region is formed in the vicinity of the center of the side surface.
(6)
The semiconductor chip according to any one of (1) to (8), wherein the recesses each have a depth from 1 μm to 3 μm.
(10)
The semiconductor chip according to any one of (1) to (9), wherein the strip-shaped region has a width at least one fifth of the thickness of the semiconductor chip.
(11)
The semiconductor chip according to any one of (1) to (10), wherein the semiconductor chip has a thickness less than 100 μm.
(12)
A manufacturing method carried out by a semiconductor chip manufacturing device, wherein
    the device manufactures a semiconductor chip having a strip-shaped region including a plurality of recesses on a side surface of a semiconductor chip, and the device forms the recesses by internally focusing laser light.

REFERENCE SIGNS LIST

11 Semiconductor chip
12 Substrate
13 Electrode
14 Circuit pattern
15 Projection electrode
16 Underfill
21 Semiconductor device
111 Semiconductor chip
112 Underfill pocket region
113 Underfill pocket
121 Semiconductor device
211 Substrate
212 Dicing tape
213 Needle pin
221 Laser light
222 Focus lens

The invention claimed is:

1. A semiconductor chip, comprising:
one or more strip-shaped regions on a side surface of the semiconductor chip, wherein
   the one or more strip-shaped regions include a plurality of recesses,
   each recess of the plurality of recesses defines a corresponding three-dimensional enclosure,
   the plurality of recesses is in a matrix of rows and columns on the side surface of the semiconductor chip,
   each row of the rows of the matrix comprises a set of first recesses of the plurality of recesses, and
   each column of the columns of the matrix comprises a set of second recesses of the plurality of recesses.

2. The semiconductor chip according to claim 1, wherein the plurality of recesses is in a zig-zag pattern in the one or more strip-shaped regions.

3. The semiconductor chip according to claim 1, further comprising a plurality of strip-shaped regions, wherein the plurality of strip-shaped regions includes the one or more strip-shaped regions.

4. The semiconductor chip according to claim 1, wherein each strip-shaped region of the one or more strip-shaped regions is at a position between opposite ends of the side surface of the semiconductor chip.

5. The semiconductor chip according to claim 1, wherein the one or more strip-shaped regions are partly inclined relative to a horizontal plane of the semiconductor chip.

6. The semiconductor chip according to claim 1, wherein
   a position of a strip-shaped region of the one or more strip-shaped regions on the side surface of the semiconductor chip is based on an amount of underfill in a semiconductor device associated with the semiconductor chip, and the underfill is in a gap between the semiconductor chip and a substrate of the semiconductor device.

7. The semiconductor chip according to claim 1, wherein the one or more strip-shaped regions are in a vicinity of a center of the side surface of the semiconductor chip.

8. The semiconductor chip according to claim 1, wherein a depth of each recess of the plurality of recesses is between 1 $\mu$m to 3 $\mu$m.

9. The semiconductor chip according to claim 1, wherein a width of each strip-shaped region of the one or more strip-shaped regions is at least one fifth of a thickness of the semiconductor chip.

10. The semiconductor chip according to claim 1, wherein a thickness of the semiconductor chip is less than 100 $\mu$m.

11. A method of manufacturing a semiconductor chip by a semiconductor chip manufacturing device, wherein the method comprises:
   forming the semiconductor chip on a substrate;
   forming one or more strip-shaped regions on a side surface of the semiconductor chip; and
   forming a plurality of recesses on the one or more strip-shaped regions by internally focusing laser light on the substrate, wherein
   each recess of the plurality of recesses defines a corresponding three-dimensional enclosure,
   the plurality of recesses is in a matrix of rows and columns on the side surface of the semiconductor chip,
   each row of the rows of the matrix comprises a set of first recesses of the plurality of recesses, and
   each column of the columns of the matrix comprises a set of second recesses of the plurality of recesses.

* * * * *